(12) United States Patent
Rivers et al.

(10) Patent No.: US 11,605,943 B2
(45) Date of Patent: Mar. 14, 2023

(54) MULTIPLE FREQUENCY GROUND FAULT PROTECTION

(71) Applicant: ABB Schweiz AG, Baden (CH)

(72) Inventors: Cecil Rivers, West Hartford, CT (US); David Joseph Lituchy, West Hartford, CT (US); Dennis Soasti, Atlanta, GA (US)

(73) Assignee: ABB SCHWEIZ AG, Baden (CH)

( * ) Notice: Subject to any disclaimer, the term of this patent is extended or adjusted under 35 U.S.C. 154(b) by 26 days.

(21) Appl. No.: 17/212,347

(22) Filed: Mar. 25, 2021

(65) Prior Publication Data

US 2022/0311234 A1    Sep. 29, 2022

(51) Int. Cl.
*H02H 3/16* (2006.01)
*G01R 31/52* (2020.01)
*H02H 1/00* (2006.01)

(52) U.S. Cl.
CPC .............. *H02H 3/16* (2013.01); *G01R 31/52* (2020.01); *H02H 1/0007* (2013.01)

(58) Field of Classification Search
CPC ......... H02H 3/16; H02H 1/0007; G01R 31/52
See application file for complete search history.

(56) References Cited

U.S. PATENT DOCUMENTS

| | | | |
|---|---|---|---|
| 6,292,717 B1* | 9/2001 | Alexander | ......... G01R 19/2513 |
| | | | 700/83 |
| 6,532,139 B2 | 3/2003 | Kim et al. | |
| 7,885,045 B1 | 2/2011 | Morgan et al. | |
| 2003/0006900 A1* | 1/2003 | Forster | ..................... G01S 19/14 |
| | | | 340/552 |
| 2003/0156367 A1 | 8/2003 | Macbeth | |
| 2005/0083616 A1 | 4/2005 | Reid et al. | |
| 2005/0286184 A1 | 12/2005 | Campolo | |
| 2008/0140354 A1 | 6/2008 | Kolker et al. | |
| 2009/0160425 A1 | 6/2009 | Berland et al. | |
| 2009/0198459 A1 | 8/2009 | Bilac et al. | |
| 2010/0309592 A1 | 12/2010 | Kinsel | |
| 2010/0324747 A1 | 12/2010 | Lee et al. | |
| 2011/0080177 A1 | 4/2011 | Beck et al. | |
| 2011/0216453 A1 | 9/2011 | Haines et al. | |
| 2012/0098672 A1* | 4/2012 | Restrepo | .............. H02H 1/0015 |
| | | | 340/815.45 |
| 2012/0119918 A1 | 5/2012 | Williams | |

(Continued)

*Primary Examiner* — Scott Bauer

(74) *Attorney, Agent, or Firm* — Greenberg Traurig, LLP

(57) ABSTRACT

A GFCI includes a current sensor system providing a current sensor signal indicating a leakage current of the AC power system. At least one signal conditioning channel conditions the current sensor signal to provide a conditioned current sensor signal. An integrated circuit-based controller is configured to receive the conditioned current sensor signal. The integrated circuit-based controller is configured to execute instructions stored in at least one nontransitory memory medium to determine at least one frequency value and at least one magnitude value of the conditioned current sensor signal, evaluate a trip condition in response to the at least one frequency value and the at least one magnitude value, and provide a fault trip signal in response to evaluation of the trip condition. A circuit breaker mechanism is configured to open a circuit of the AC power system in response to the fault trip signal.

22 Claims, 6 Drawing Sheets

(56) References Cited

U.S. PATENT DOCUMENTS

| | | | |
|---|---|---|---|
| 2014/0049860 A1* | 2/2014 | Arima | G01R 31/52 |
| | | | 361/42 |
| 2015/0109077 A1 | 4/2015 | Tomimbang et al. | |
| 2017/0149235 A1 | 5/2017 | Cui et al. | |
| 2019/0356127 A1 | 11/2019 | Ostrovsky et al. | |
| 2021/0096192 A1* | 4/2021 | Haines | H02H 3/006 |

* cited by examiner

MULTIPLE FREQUENCY GROUND FAULT PROTECTION

TECHNICAL FIELD

The present disclosure relates generally to ground fault circuit interrupters and more particularly but not exclusively to multiple frequency ground fault protection and multi-frequency or wide-band ground fault circuit interrupter apparatuses, systems, and methods.

BACKGROUND

Ground fault circuit interrupters ("GFCI") are useful in a number of applications including electrical outlets and receptacles, in-line electrical with appliances or their power cords, and circuit breaker boxes, cabinets, or other enclosures, among other applications. Existing GFCI suffer from a number of drawbacks, limitations, and shortcomings. For example, many focus on ground fault currents around 60 Hz or other frequencies associated with electrical utility power supplies (e.g., 50 Hz) and fail to accurately detect and interrupt ground faults at higher frequencies or over a broader frequency range. Additionally, many existing GFCI suffer from undesirable complexity, power consumption, failure modes, and other shortcomings. There remains a significant unmet need for the unique apparatuses, methods, systems, and techniques disclosed herein.

DISCLOSURE OF EXAMPLE EMBODIMENTS

For the purposes of clearly, concisely, and exactly describing example embodiments of the present disclosure, the manner, and process of making and using the same, and to enable the practice, making and use of the same, reference will now be made to certain example embodiments, including those illustrated in the figures, and specific language will be used to describe the same. It shall nevertheless be understood that no limitation of the scope of the invention is thereby created, and that the invention includes and protects such alterations, modifications, and further applications of the example embodiments as would occur to one skilled in the art.

SUMMARY OF THE DISCLOSURE

Some example embodiments comprise unique GFCI configured to detect a ground fault condition of an AC power system and to open a circuit of the AC power system in response to the ground fault condition. Further embodiments, forms, objects, features, advantages, aspects, and benefits of the disclosed embodiments are elucidated by the following description and drawings.

DETAILED DESCRIPTION OF EXAMPLE EMBODIMENTS

Figure 1:
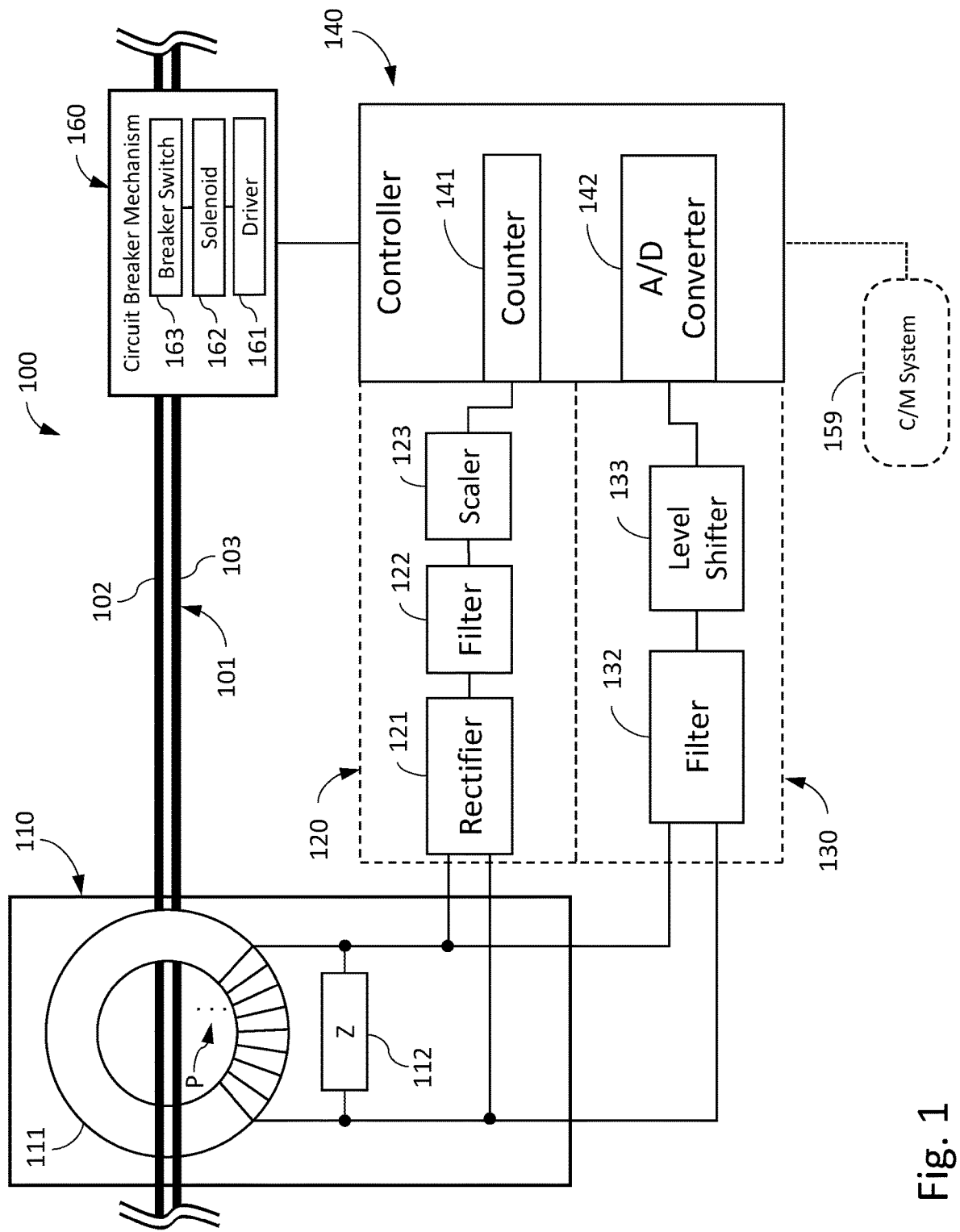
FIG. 1 is a circuit diagram illustrating certain aspects of an example GFCI.

With reference to FIG. 1, there is illustrated an example ground fault circuit interrupter 100 (also referred to herein as GFCI 100). GFCI 100 includes a current sensor system 110 which is operatively coupled with and structured to sense current through an alternating current electrical power system 101 (also referred to herein as AC power system 101). A first current sensor signal conditioning channel 120 (also referred to herein as first channel 120) is operatively coupled with the current sensor system 110 and receives or obtains a current sensor signal therefrom. A second current sensor signal conditioning channel 130 (also referred to herein as second channel 130) is operatively coupled with the current sensor system 110 and receives or obtains a first channel signal therefrom. An integrated circuit-based controller 140 (also referred to herein as controller 140) is operatively coupled with the first channel 120 and the second channel 130 and receives or obtains a second channel signal therefrom. A circuit breaker mechanism 160 is operatively coupled with the controller 140 and receives or obtains a fault trip signal therefrom.

In the illustrated example, the AC power system 101 includes a phase conductor 102 and a neutral conductor 103. As indicated by ellipsis P, in some embodiments, the AC power system 101 may be provided with one or more additional conductors. In some embodiments, the AC power system 101 may be configured as a split-phase system including two phase conductors and a neutral conductor. In some embodiments, the AC power system 101 may be configured as a three-phase system including three phase conductors and a neutral conductor. More generally, in some embodiment, the AC power system 101 may be configured as an n-phase system including n phase conductors and at least one neutral conductor. In some embodiment, the AC power system 101 may be configured to include other numbers and arrangements of one or more phase conductors and at least one neutral conductor.

In the illustrated example, the current sensor system 110 includes a current transformer 111 which is operatively coupled with the phase conductor 102 and the neutral conductor 103 on a primary side (also referred to as a primary winding or primary conductor) and operatively coupled with one or more impedance components 112 (e.g., a resistor, a capacitor, a resistor in combination with a capacitor, or other arrangements including resistive, capacitive elements, and/or other impedance components) on a secondary side (also referred to as a secondary winding or a secondary conductor). The current transformer 111 is one example of a current sensor which may be utilized in the current sensor system 110 to provide a current sensor signal indicating a leakage current (sometimes referred to as a residual current) of the power system 101. Other embodiments may additionally or alternatively include and utilize other types of current sensors including, for example, current transformers dedicated to individual conductors, multiple current transformers dedicated to respective sets of one or more conductors, shunt resistors or other current sensing resistor arrangements, Hall-effect current sensors, fluxgate current sensors, quadrature current transformers, Rogowski coils, Faraday-effect current sensors, or other types of current sensors.

In the illustrated example, the current transformer 111 is a differential current transformer configured to provide a secondary side current with a magnitude proportional to the sum of the magnitudes of the primary side currents through at least two conductors (e.g., phase conductor 102 and neutral conductor 103). Due to the opposing polarity of the primary side currents, the magnitude of the secondary side current indicates a difference between the magnitudes of the primary side current which, in turn, indicates a leakage current of the AC power system 101. A portion of the difference may be attributable to impedance or other losses of the AC power system 101. Another portion of the difference may indicate a ground fault condition of the AC power system. Accordingly, a leakage current exceeding a certain magnitude may indicate a ground fault condition. In some embodiments, individual current sensors may be utilized for individual conductors of the AC power system 101 and their respective current sensor outputs may be utilized to indicate a difference between currents of the at least two conductors of the AC power system 101 and, in turn, to indicate a leakage current of the AC power system 101.

GFCI 100 includes a first channel 120 which is operatively coupled with the current sensor system 110. The first channel 120 includes a rectifier 121, a filter 122, and a scaler 123. The rectifier 121 is configured to rectify a current sensor signal received from the current sensor system 110. The rectifier 121 may be provided in a number of forms including, for example, a half-wave rectifier, a full-wave rectifier, a bridge rectifier, a center tap rectifier, or another type of rectifier. In some embodiments, the rectifier 121 may be provided in the form of a passive or uncontrolled rectifier. In some embodiments, the rectifier 121 may be provided in the form of an active or controlled rectifier. In some embodiments, the rectifier 121 may be provided in whole or in part as a combination of discrete components which may include passive components such as arrangements of diodes or other passive or semi-passive semiconductor devices as well as active components such as active semiconductor devices, or other discrete integrated circuits. In some embodiments, the rectifier 121 be provided in whole or in part as an on-board or integral portion of the controller 140, such as in the case of a hybrid analog-digital controller or a system-on-chip and may be implemented using hardware, firmware, software, or combinations thereof.

The filter 122 is configured to filter the rectified current sensor signal received from the rectifier 121 and may be configured as a bandpass filter, a low pass filter, a high pass filter, combinations thereof, or other types or combinations of filters operable to isolate a frequency range of interest for ground fault detection. The filter 122 may be provided in a number of forms. In some embodiments, the filter 122 may be provided in whole or in part as a combination of discrete components which may include passive components such as arrangements of resistive, capacitive, or other impedance elements as well as active components such as operational amplifiers or other discrete integrated circuits. In some embodiments, the filter 122 may be provided in whole or in part as an on-board or integral portion of the controller 140, such as in the case of a hybrid analog-digital controller or a system-on-chip.

The scaler 123 is configured to scale the filtered, rectified current sensor signal received from filter 122. The scaler 123 may be provided in a number of forms including, for example, forms integral to the filter 122 such as where the filter has a non-zero gain, or forms discrete or separate from the filter 122. In some embodiments, the scaler 123 may be provided in whole or in part as a combination of discrete components which may include passive components such as arrangements of resistive, capacitive, or other impedance elements as well as active components such as operational amplifiers or other discrete integrated circuits. In some embodiments, the scaler 123 may be provided in whole or in part as an on-board or integral portion of the controller 140, such as in the case of a hybrid analog-digital controller or a system-on-chip. The output of the scaler 123 (which may also be considered an example of a first channel signal) is pulled to or received by an input of a counter 141 of a controller 140.

It shall be appreciated that the aforementioned components and devices utilized in the first channel to perform rectification, filtering, scaling, are one example of an apparatus and technique to generate a generally square waveform output in response to a sinusoidal input achieving. It shall be appreciated that a number of components and devices may be utilized in the first channel to perform rectification, filtering, scaling, and/or other signal conditioning to provide signals useable by the counter 141. Some embodiments may utilize a voltage divider circuit to pull up diodes and generate a generally square waveform output in response to a sinusoidal input. Some embodiments may utilize arrangements of logic gates in combination to generate pulse outputs corresponding to a generally square waveform output in response to a sinusoidal input.

GFCI 100 includes a second channel 130 which is operatively coupled with the current sensor system 110. The second channel 130 includes filter 132 which is configured to filter the current sensor signal received from the current sensor system 110. The filter 132 may be provided in a number of forms including, for example, the forms described above in connection with the filter 122

The second channel 130 includes a level shifter 133 which is operatively coupled with the filter 132 and receives the filtered current sensor signal therefrom. The level shifter 133 may be configured to shift, offset, amplify, and/or scale the filtered current sensor signal to a level adapted for controller 140. The level shifter 133 may be provided in a number of forms including, for example, forms integral to the filter 132 such as where the filter has a non-zero gain, or forms discrete or separate from the filter 132. In some embodiments, the level shifter 133 may be provided in whole or in part as a combination of discrete components which may include passive components such as arrangements of resistive, capacitive, or other impedance elements as well as active components such as operational amplifiers or other discrete integrated circuits. In some embodiments, the level shifter 133 may be provided in whole or in part as an on-board or integral portion of the controller 140, such as in the case of a hybrid analog-digital controller or a system-on-chip. The output of the level shifter 133 (which may also be considered an example of a second channel signal) is pulled to or received by an input to an analog-to-digital (A/D) converter 142 of the controller 140. The level shifter 133 may be configured to provide an output to that is adapted to the signal range of the A/D converter 142 (e.g., between 0V and Vcc).

The controller 140 is operatively coupled with the first channel 120 and the second channel 130. The controller 140 may comprise or may be implemented in a number of forms including, for example, a microcontroller, a microprocessor, an application specific integrated circuit (ASIC), a field programmable gate array (FPGA), other types of integrated circuit-based controllers, combinations of the foregoing with one another and combinations of the foregoing for non-transitory memory media. The controller 140 may be configured to configured to provide a fault trip signal indicating ground fault condition of the AC power system in response to the first channel signal and the second channel signal. For example, the controller 140 may be configured to receive the conditioned current sensor signal, the integrated circuit-based controller being configured to execute instructions stored in at least one nontransitory memory medium to determine at least one frequency value and at least one magnitude value of the conditioned current sensor signal, evaluate a trip condition in response to the at least one frequency value and the at least one magnitude value, and provide a fault trip signal in response to evaluation of the trip condition.

A circuit breaker mechanism 160 is operatively coupled with the controller 140 and is configured to open a circuit of the AC power system in response to the fault trip signal. In the illustrated example, the circuit breaker mechanism 160 includes a driver 161 configured to drive a solenoid 162 to open a breaker switch 163 in response to the fault trip signal. In other embodiments, a number of other circuit breaker mechanisms configured to trip or open in response to an electrical signal may be utilized as will occur to those of skill in the art with the benefit of the present disclosure. In some embodiments, the fault trip signal may also be provided to a control and/or monitoring (C/M) system, 159 which may log or record instances of the fault trip signal and may utilize the fault trip signal in providing alerts or warnings or initiating automated control operations.

It shall be appreciated that the signals described herein comprise characteristics of a non-transitory medium such as circuitry or components which when configured or operated with the described signals may be considered a non-transitory memory medium configured to store input, output, provide, or receive information of the signals. For example, the analog circuitry, components, and devices of GFCI 100 described above or GFCI 100' or GFCI 100" described below may be considered non-transitory analog memory media configured to store a signal for at least some duration or under at least some operating conditions. It shall be further appreciated that, in the illustrated example the current sensor signal, the first channel signal, the second channel signal, and the fault trip signal comprise voltage signals and that the corresponding circuitry and devices that provide these signals as outputs, receive these signals as inputs, and/or convert or otherwise act upon these signals are configured and provided in forms suitable for operation with voltage signals. In other embodiments, these signals may comprise current signals and the corresponding circuitry and devices may be configured and provided in forms suitable for operation with current signals.

Figure 2:
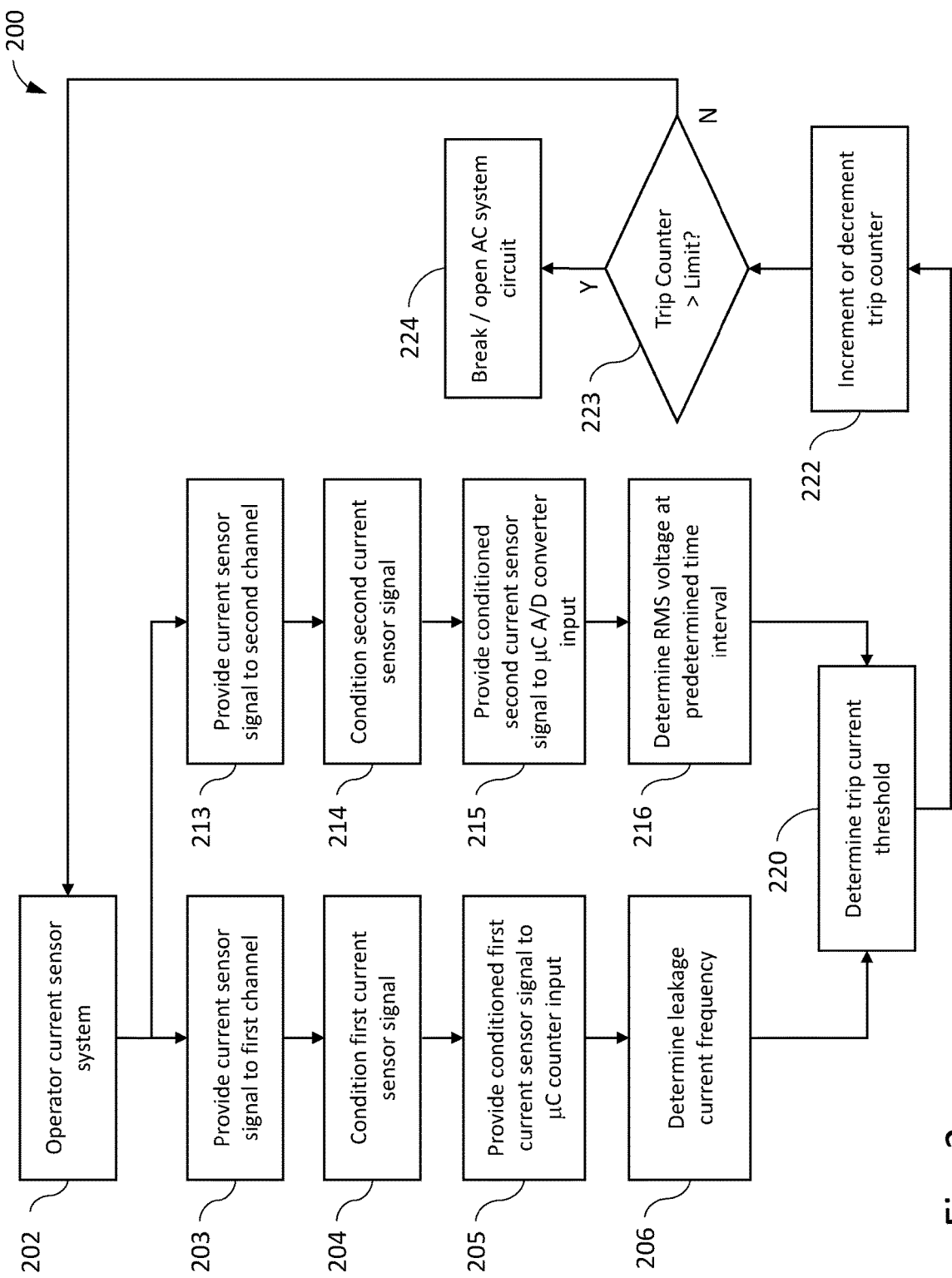
FIG. 2 is a flow diagram illustrating certain aspects of an example method of operating a GFCI.

With reference to FIG. 2, there is illustrated an example process 200 which may be implemented or performed by a GFCI such as GFCI 100 and which provides one example of a method of operating a GFCI such as GFCI 100. Process 200 begins at operation 202 which operates a current sensor system to provide a current sensor signal indicating a leakage current of an AC power system. In some embodiments, operation 202 may include operating a current transformer operatively coupled with at least a phase conductor and a neutral conductor of an AC power system on a primary side and operatively coupled with an impedance component on a secondary side to provide a voltage across the impedance component. In some embodiments, operation 202 may additionally include amplifying the voltage across the impedance component to provide the current sensor signal. In some embodiments, the current sensor signal may comprise a current signal. In some embodiments, the current sensor signal may be otherwise adjusted, conditioned, converted, filtered, or otherwise operated upon by the sensor system to provide the current sensor signal in a desired form. Operation 202 may be performed, for example, by the current sensor system 110 of GFCI 100 or another current sensor system.

From operation 202, process 200 proceeds to operations 203 and 213 which may be performed at least partially concurrently or at least partially in parallel. Operation 203 provides the current sensor signal to a first channel such as the first channel 120 of GFCI 100 or a first channel of another GFCI. From operation 203, process 200 proceeds to operation 204 in which the first channel conditions the current sensor signal by rectifying, filtering, and scaling the input received from the current sensor system 110 of GFCI 100 or another current sensor system and such operations may be performed, for example, by the rectifier 121, filter 122, and scaler 123 of the first channel 120 of the current sensor system 110.

From operation 204, process 200 proceeds to operation 205 in which the conditioned (e.g., rectified, filtered, and scaled) current sensor signal (which may also be considered an example of a first channel signal) is pulled into or received by an input to a counter of a controller, such as the input to counter 141 of controller 140 or another counter input and/or controller. The counter counts the number of pulses received from the first channel for a predetermined period of time (typically on the order of ms). In response, at operation 206, the controller may determine a leakage current frequency in response to the number of pulses counted by the counter divided by the period of time.

Operation 213 provides the current sensor signal to a second channel such as the second channel 130 of GFCI 100 or a second channel of another GFCI. From operation 213, process 200 proceeds to operation 214 in which the second channel conditions the current sensor signal by filtering and level shifting the input received from the current sensor system 110 of GFCI 100 or another current sensor system and such operations may be performed, for example, by the filter 132 and level shifter 133 of the first channel 120 of the current sensor system 110.

From operation 214, process 200 proceeds to operation 215 in which the filtered and level shifted current sensor signal (which may also be considered an example of a second channel signal) is pulled into or received by an input to an A/D converter of a controller, such as the input to A/D converter 142 of controller 140 or another counter input and/or controller. The sampling rate of the input to the A/D converter of the controller may provide a further frequency filtering effect corresponding to the sampling rate at which it operates. The A/D converter samples may pull, receive, or sample such input at a predetermined time interval, for example, in some embodiments on the order of 8.33 ms. In response, at operation 216 the controller may calculate or determine an RMS signal value in response to the sampled input and a predetermined time interval.

At operation 220, the controller may determine a trip threshold current. The controller may determine a trip threshold current in one of several ways. In some forms, the controller may feed a calculated frequency into a transfer function or filter, such as a threshold curve equation or approximation of a threshold curve equation, which generates a corresponding trip threshold current. In some forms, the controller may compare the calculated frequency with the values of a lookup table. In some forms, the controller may utilize other techniques as will occur to one of skill in the art with the benefit of the present disclosure.

At operation 222, the controller may increment or decrement a trip counter in response to the trip threshold and the RMS current. The trip count may be calculated based on the number of cycles (time intervals) needed in order to trip, for example, in accordance with the equation: $T=D/(1-I/I_{pickup})$ where T=trip time, D=delay setting, I=RMS current, $I_{pickup}$=trip threshold. The number of cycles=T/(time of cycle). If the RMS current is greater than the trip threshold at a given evaluation, the controller 140 increments the trip counter. After each change to the trip counter, the controller at operation 223 may evaluate whether the trip counter is greater than (or is greater than or equal to a threshold). Once the counter reaches a limit, for example, a number of time intervals associated with the trip time, the controller outputs a trip signal at operation 224 in response to which circuit breaker mechanism 160 is tripped. If the RMS current is less than the trip threshold for the current time interval, the controller decrements the counter, for example, in accordance with the equation: Counter_new_value=Counter_previous_value*exp(−(time interval)/2). The controller may also implement a decrement limit so that the trip counter does not decrease below zero.

It shall be appreciated that process 200 is one example by which a GFCI such as GFCI 100 may operate a controller, such as controller 140 to detect a ground fault condition of an AC power system in response to a first channel signal and a second channel signal. Thus, for example, in response to such signals, the controller may open a circuit of an AC power system in response to the detection of a ground fault condition by communicating with or controlling a circuit breaker mechanism such as circuit breaker mechanism 160 of GFCI 100, or another circuit breaker mechanism. In some embodiments, such operation may include operating a driver (e.g., driver 161) to actuate a solenoid (e.g., solenoid 162) to open a breaker switch (e.g., breaker switch 163) in response to a fault determination.

It shall be appreciated that process 200 may utilize a variety of signal types in performing the foregoing operations. For example, one or more of the current sensor signal, the first channel signal, and the second channel signal may comprise voltage signals or may comprise current signals. It shall be further appreciated that GFCI 100 and process 200 are example solutions for providing multiple frequency ground fault protection. A number of other example solutions are contemplated as shall be appreciated from the present disclosure.

Figure 3:
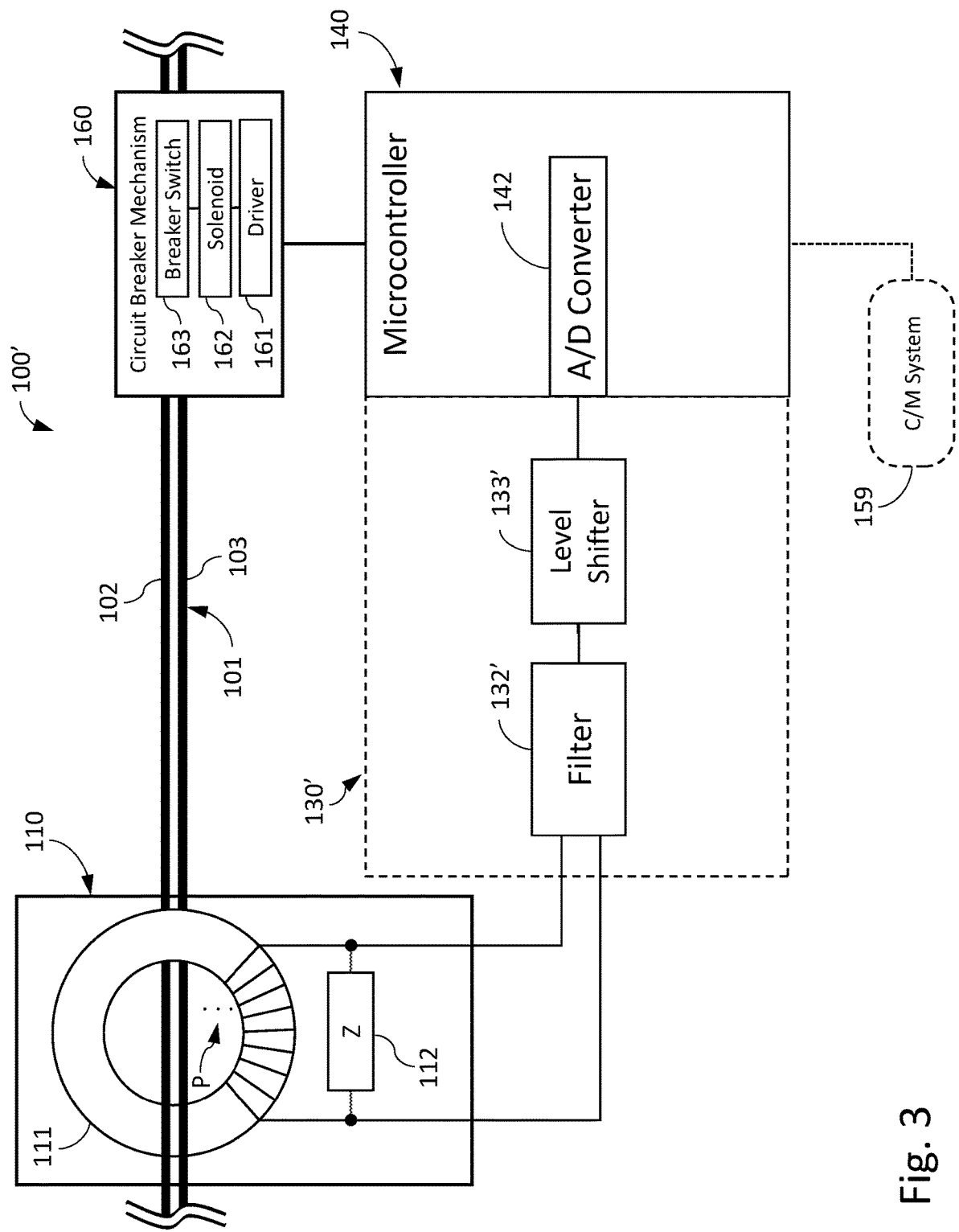
FIG. 3 is a circuit diagram illustrating certain aspects of an example GFCI.

With reference to FIG. 3, there is illustrated an example ground fault circuit interrupter 100' (also referred to herein as GFCI 100'). GFCI 100' includes a number of features that are the same as or substantially similar to those described above in connection with GFCI 100. Such features are labeled with the same reference numerals as those utilized in FIG. 1 and the description thereof. It shall be appreciated that such features include the same or substantially similar characteristics, components, devices, elements, functionalities, operations, and other attributes as those described in connection with GFCI 100 and FIG. 1, including the illustrated examples and the described additions, alternatives, and variations thereof.

GFCI 100' also includes a number of additional or alternative features, including omitted features, relative to those described above in connection with GFCI 100. It shall be appreciated that such features may include some or all of the same or substantially similar characteristics, components, devices, elements, functionalities, operations, and other attributes as those described in connection with GFCI 100 and FIG. 1. For example, GFCI 100' includes a channel 130' which may correspond to or be the same or substantially similar to the second channel 130 but omits a channel corresponding to the first channel 120. Channel 130' includes a filter 132' and a level shifter 133' which may correspond to or be the same or substantially similar to the filter 132 and the level shifter 133 of the second channel 130.

Figure 4:
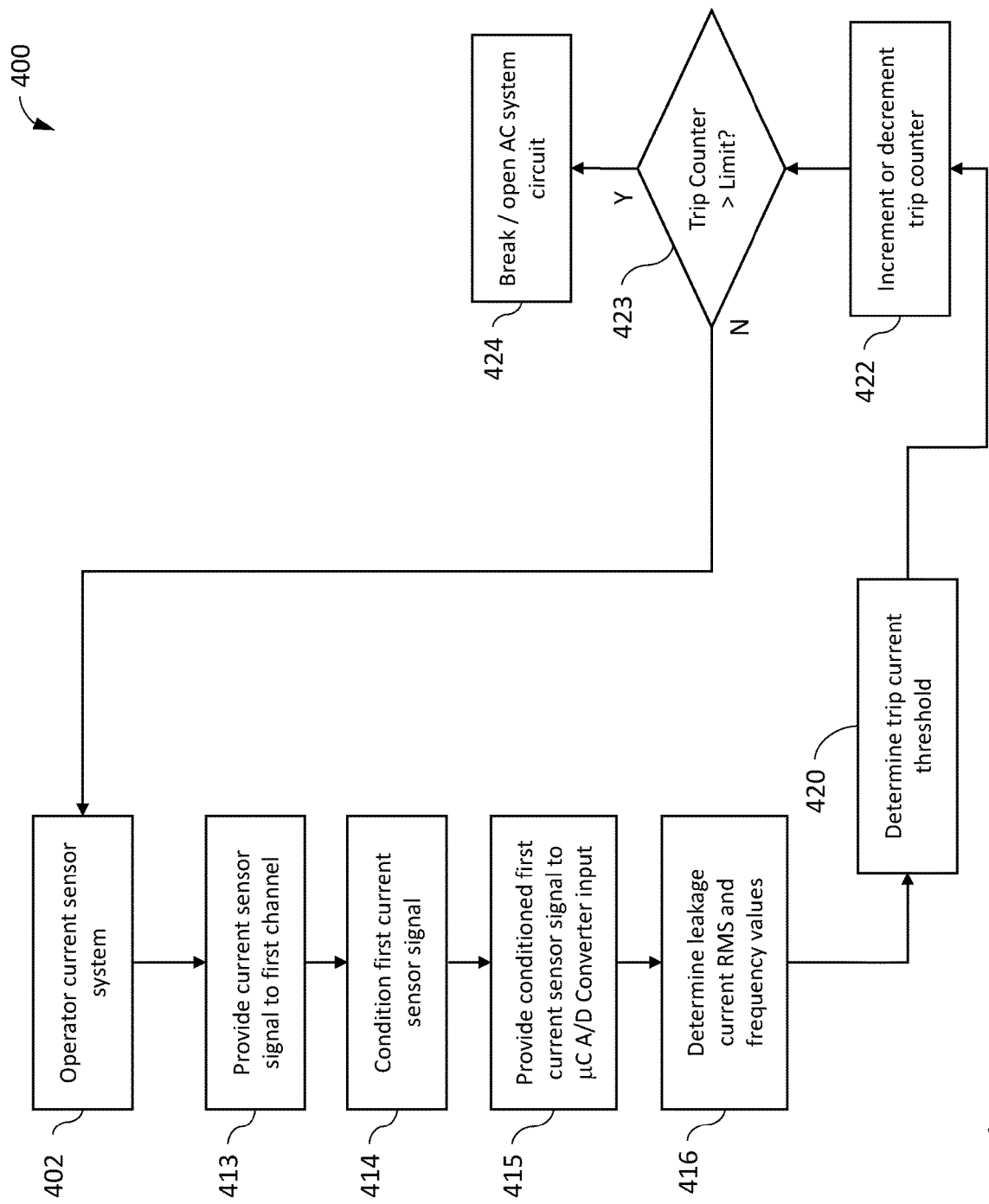
FIG. 4 is a flow diagram illustrating certain aspects of an example method of operating a GFCI.

With reference to FIG. 4, there is illustrated an example process 400 which may be implemented or performed by a GFCI such as GFCI 100' and which provides one example of a method of operating a GFCI such as GFCI 100'.

Process 400 begins at operation 402 which operates a current sensor system to provide a current sensor signal indicating a leakage current of an AC power system. Operation 402 may be performed in connection with and may utilize components, devices, operations, and techniques such as those of operation 202 described in connection with FIG. 2.

From operation 402, process 400 proceeds to operation 413 which provides the current sensor signal to a conditioning channel such as the channel 130' of GFCI 100' or a conditioning channel of another GFCI. From operation 413, process 400 proceeds to operation 414 in which the conditioning channel conditions the current sensor signal by filtering and level shifting the input received from the current sensor system 110 of GFCI 100' or another current sensor system and such operations may be performed, for example, by the filter 132 and level shifter 133 as described above in connection with FIG. 1.

From operation 414, process 400 proceeds to operation 415 in which the filtered and level shifted current sensor signal (which may also be considered an example of a second channel signal) is pulled into or received by an input to an A/D converter of a controller, such as the input to A/D converter 142 of the controller 140 or another counter input and/or controller. The sampling rate of the input to the A/D converter of the controller may provide a further frequency filtering effect corresponding to the sampling rate at which it operates. The A/D converter 142 may pull, receive, or sample such input at a predetermined time interval, for example, in some embodiments on the order of 8.33 ms. In response, at operation 416, the controller may calculate an RMS signal value from the sampled input, for example, using the techniques described in connection with process 200.

At operation 416 the controller may determine one or more frequency components of the filtered and level shifted current sensor signal using a number of techniques. In some embodiments, the controller may determine one or more frequency components of the filtered and level shifted current sensor signal using a time-to-frequency domain transformation technique, such as a fast Fourier transform (FFT) or a variation or extension thereof. Such techniques may be used to calculate one or more frequency components of the filtered and level shifted current sensor signal at a fixed interval. The controller may further determine a frequency of interest using a number of techniques. In some forms, the controller may select a frequency bin with the highest magnitude. In some forms, the controller may determine a weighted average of two or more frequency components of the filtered and level shifted current sensor signal up to and including all frequencies above a minimum threshold which may be adjustable or calibratible.

In some embodiments, the controller may determine one or more frequency components of the filtered and level shifted current sensor signal using a technique wherein the number of peaks or maxima are counted. The number of peaks or maxima divided by the time interval corresponds to the frequency of the signal. In some embodiments, the controller may determine one or more frequency components of the filtered and level shifted current sensor signal using an autocorrelation technique wherein a measured signal is copied and time delayed. The autocorrelation between the two signals generates peaks where the two signals overlap. The time difference between the peaks corresponds to the period of the signal and the inverse of the period is the frequency. The foregoing and other techniques may be utilized by the controller to determine or identify a frequency of the leakage current.

At operation 420 the controller may determine a trip threshold current. The controller may determine a trip threshold current in any of a number of ways using any of a number of techniques including, for example, those described above in connection with process 200 of FIG. 2. At operation 422, the controller may increment or decrement a trip time counter in response to the trip threshold and the RMS current. The controller may increment or decrement a trip time counter in any of a number of ways using any of a number of techniques including, for example, those described above in connection with process 200 of FIG. 2. After each change to the trip counter, the controller at operation 423 may evaluate whether the trip counter is greater than (or is greater than or equal to a threshold). Once the counter reaches a limit, for example, a number of time intervals associated with the trip time, the controller outputs a trip signal at operation 424 in response to which circuit breaker mechanism 160 is tripped. If the RMS current is less than the trip threshold for the current time interval, the controller decrements the counter, for example, in accordance with the equation: Counter_new_value=Counter_previous_value*exp(−(time interval)/2). The controller may also implement a decrement limit so that the trip counter does not decrease below zero.

It shall be appreciated that the process 400 is one example by which a GFCI such as GFCI 100' may operate a controller, such as controller 140' to detect a ground fault condition of an AC power system in response to a first channel signal and a second channel signal. Thus, for example, in response to such signals, the controller may open a circuit of an AC power system in response to the detection of a ground fault condition by communicating with or controlling a circuit breaker mechanism such as circuit breaker mechanism 160 of GFCI 100', or another circuit breaker mechanism. In some embodiments, such operation may include operating a driver (e.g., driver 161) to actuate a solenoid (e.g., solenoid 162) to open a breaker switch (e.g., breaker switch 163) in response to a fault determination.

It shall be appreciated that process 400 may utilize a variety of signal types in performing the foregoing operations. For example, one or more of the current sensor signal, the first channel signal, and the second channel signal may comprise voltage signals or may comprise current signals. It shall be further appreciated that GFCI 100' and process 400 are example solutions for providing multiple frequency ground fault protection. A number of other example solutions are contemplated as shall be appreciated from the present disclosure.

Figure 5:
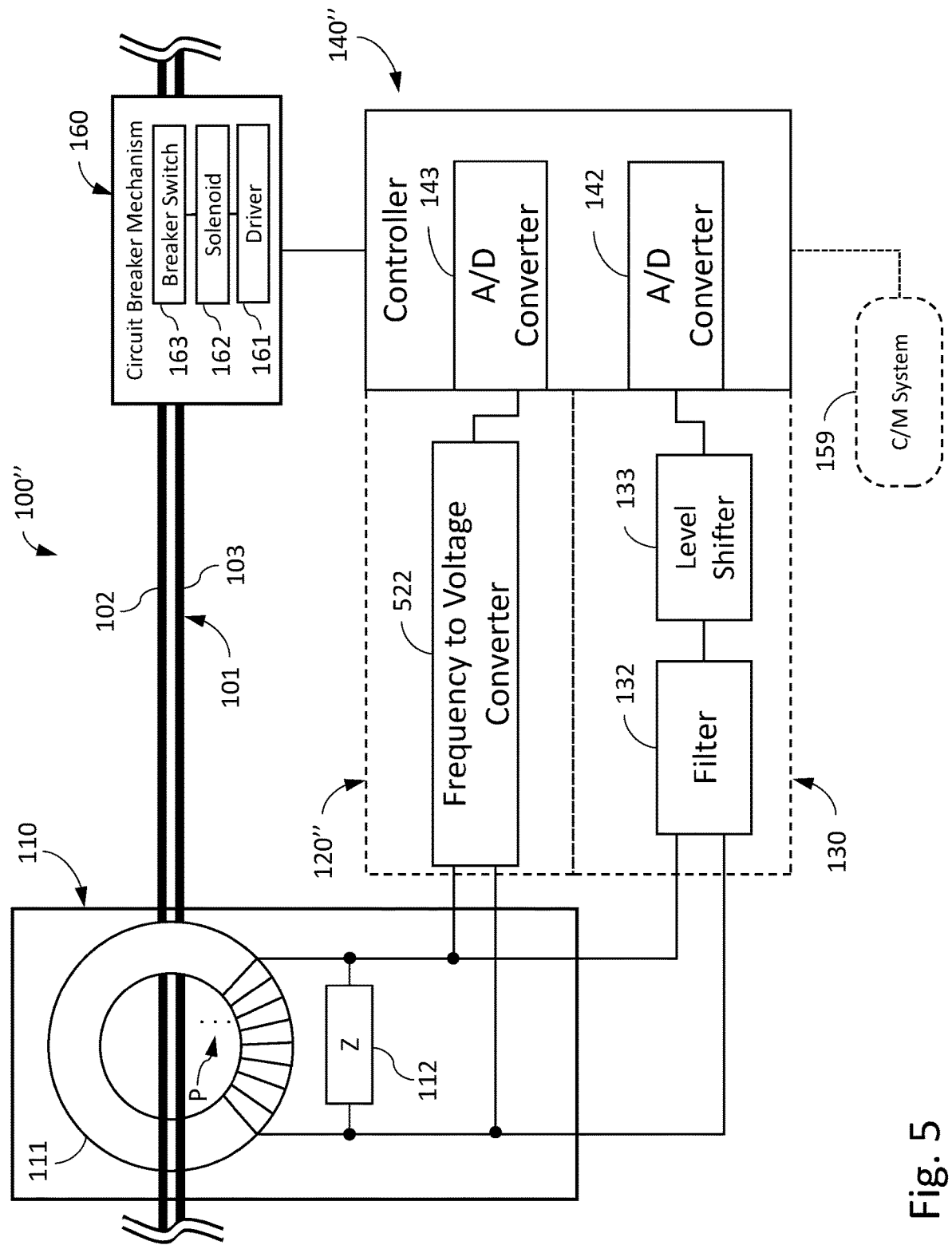
FIG. 5 is a circuit diagram illustrating certain aspects of an example GFCI.

With reference to FIG. 5, there is illustrated an example ground fault circuit interrupter 100" (also referred to herein as GFCI 100"). GFCI 100" includes a number of features that are the same as or substantially similar to those described above in connection with GFCI 100. Such features are labeled with the same reference numerals as those utilized in FIG. 1 and the description thereof. It shall be appreciated that such features include the same or substantially similar characteristics, components, devices, elements, functionalities, operations, and other attributes as those described in connection with GFCI 100 and FIG. 1, including the illustrated examples and the described additions, alternatives, and variations thereof.

GFCI 100" also includes a number of additional or alternative features, including omitted features, relative to those described above in connection with GFCI 100. It shall be appreciated that such features may include some or all of the same or substantially similar characteristics, components, devices, elements, functionalities, operations, and other attributes as those described in connection with GFCI 100 and FIG. 1, including the illustrated examples and the described additions, alternatives, and variations thereof, and may additionally or alternatively comprise features varying from or adding to those of GFCI 100 including the following examples.

GFCI 100" includes a first signal condition channel 120" (also referred to herein as first channel 120") including a frequency to voltage converter 522 which is configured to output a variable voltage or current magnitude correlated with and in response to a frequency of the received as current sensor system signal received as input from the current sensor system 110. The first channel 120" of GFCI 100" may also include filter and scaling components such as those of the first channel 120 of GFCI 110 described in connection with the GFCI 100 of FIG. 1.

GFCI 100" further includes a controller 140" which may include the same or substantially similar features as those of controller 140 described above in connection with FIG. 1. Controller 140" also includes another A/D converter 143 which receives input from the first channel 120" of the GFCI 120".

Figure 6:
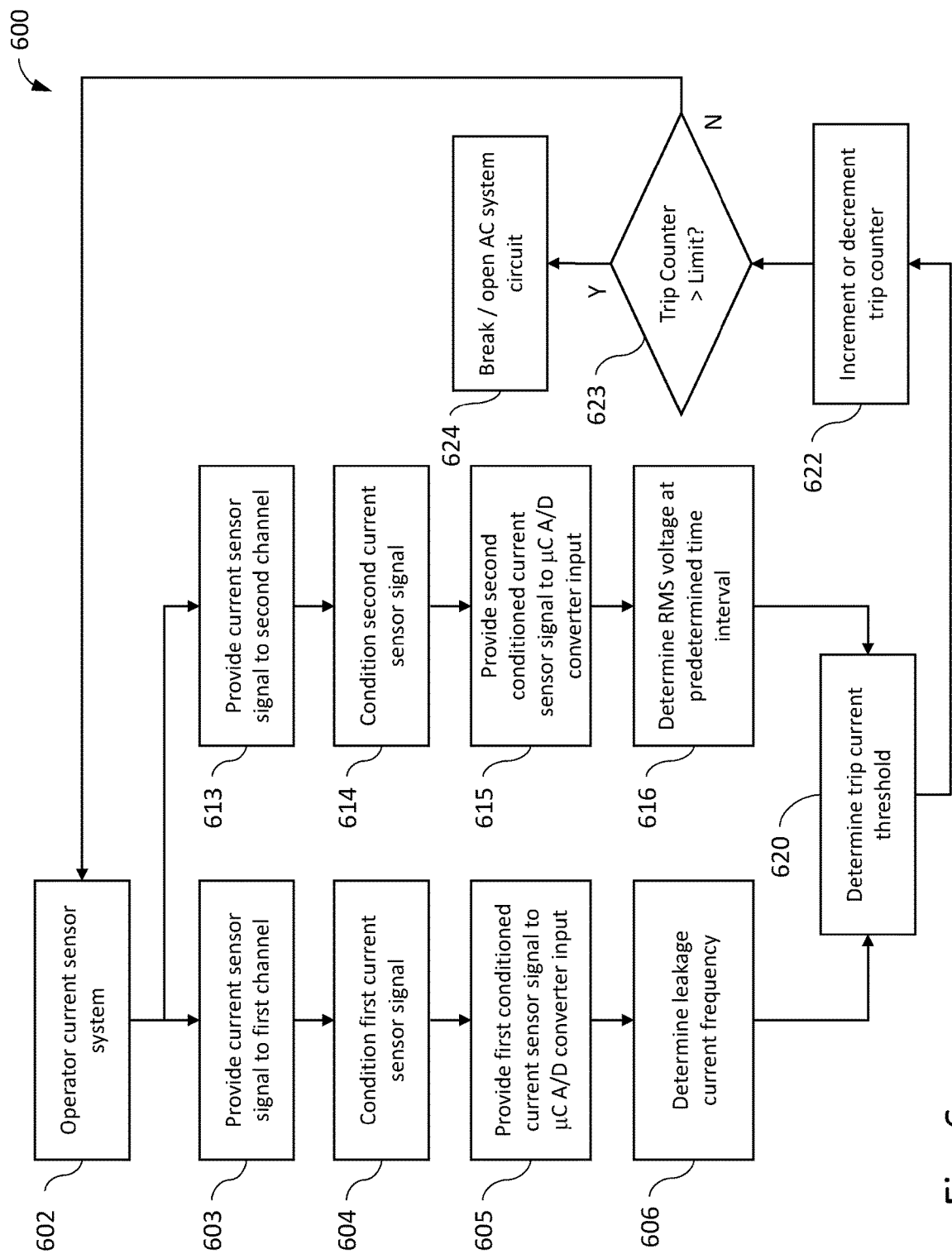
FIG. 6 is a flow diagram illustrating certain aspects of an example method of operating a GFCI.

With reference to FIG. 6, there is illustrated an example process 600 which may be implemented or performed by a GFCI such as GFCI 100" and which provides one example of a method of operating a GFCI such as GFCI 100". Process 600 begins at operation 602 which operates a current sensor system to provide a current sensor signal indicating a leakage current of an AC power system. Operation 602 may be performed in connection with and may utilize components, devices, operations, and techniques such as those of operation 202 described in connection with FIG. 2.

From operation 602, process 600 proceeds to operations 603 and 613 which may be performed at least partially concurrently or at least partially in parallel. Operation 603 provides the current sensor signal to a first channel such as the first channel 120" of GFCI 100" or a first channel of another GFCI. From operation 603, process 600 proceeds to operation 604 in which the first channel conditions the current sensor signal by outputting a variable voltage in response to a frequency of the signal received as input by the first channel 120, for example, using the frequency to voltage converter 522 of the channel 120" to output a variable voltage or current magnitude correlated with and in response to a frequency of the received as current sensor system signal received as input from the current sensor system 110.

From operation 604, process 600 proceeds to operation 605 in which the voltage signal from frequency to voltage converter 522 is pulled into or received by an input to an A/D converter input of a controller, such as the A/D input to A/D converter 143 of controller 140" or another input to an A/D converter of a controller. At operation 606, the controller determines a leakage current frequency value. The controller 140 may determine a leakage current frequency value in response to the received input to the A/D converter 143 using a number of techniques such as lookup table techniques or formula-based calculation techniques the same as or similar to those described above in connection with process 200 and process 400.

Operation 613 which provides the current sensor signal to a second conditioning channel such as channel 130 of GFCI 100" or a conditioning channel of another GFCI. From operation 613, process 600 proceeds to operation 614 in which the conditioning channel conditions the current sensor signal by filtering and level shifting the input received from the current sensor system 110 of GFCI 100' or another current sensor system and such operations may be performed, for example, by the filter 132 and level shifter 133 as described above in connection with the GFCI 100 of FIG. 1.

From operation 614, process 600 proceeds to operation 615 in which the filtered and level shifted current sensor signal (which may also be considered an example of a second channel signal) is pulled into or received by an input to an A/D converter of a controller, such as the input to A/D converter 142 of the controller 140 or another counter input and/or controller. The sampling rate of the input to the A/D converter of the controller may provide a further frequency filtering effect corresponding to the sampling rate at which it operates. The A/D converter 142 may pull, receive, or sample such input at a predetermined time interval, for example, in some embodiments on the order of 8.33 ms. In response, at operation 616 the controller may calculate an RMS signal value from the sampled input.

At operation 620, the controller may determine a trip threshold current in any of a number of ways using any of a number of techniques including, for example, those described above in connection with process 200 of FIG. 2. At operation 622, the controller may increment or decrement a trip time counter in response to the trip threshold and the RMS current. The controller may increment or decrement a trip time counter in any of a number of ways using any of a number of techniques including, for example, those described above in connection with process 200 of FIG. 2. After each change to the trip counter, the controller at operation 623 may evaluate whether the trip counter is greater than (or is greater than or equal to a threshold). Once the counter reaches a limit, for example, a number of time intervals associated with the trip time, the controller outputs a trip signal at operation 624 in response to which circuit breaker mechanism 160 is tripped. If the RMS current is less than the trip threshold for the current time interval, the controller decrements the counter, for example, in accordance with the equation: Counter_new_value=Counter_previous_value*exp(−(time interval)/2). The controller may also implement a decrement limit so that the trip counter does not decrease below zero.

It shall be appreciated that the process 600 is one example by which a GFCI such as GFCI 100' may operate a controller, such as controller 140' to detect a ground fault condition of an AC power system in response to a first channel signal and a second channel signal. Thus, for example, in response to such signals, the controller may open a circuit of an AC power system in response to detecting the ground fault condition by communicating with or controlling a circuit breaker mechanism such as circuit breaker mechanism 160 of GFCI 100', or another circuit breaker mechanism. In some embodiments, such operation may include operating a driver (e.g., driver 161) to actuate a solenoid (e.g., solenoid 162) to open a breaker switch (e.g., breaker switch 163) in response to a fault determination.

It shall be appreciated that process 600 may utilize a variety of signal types in performing the foregoing operations. For example, one or more of the current sensor signal, the first channel signal, and the second channel signal may comprise voltage signals or may comprise current signals. It shall be further appreciated that GFCI 100' and process 600 are example solutions for providing multiple frequency ground fault protection. A number of other example solutions are contemplated as shall be appreciated from the present disclosure.

Several example embodiments shall now be further described. A first example embodiment is an apparatus comprising: a current sensor system configured to operatively couple with an AC power system and configured to provide a current sensor signal indicating a leakage current of the AC power system; at least one signal conditioning channel including one or more of discrete circuit components and integrated circuit components configured to condition the current sensor signal to provide a conditioned current sensor signal; an integrated circuit-based controller operatively coupled with the at least one signal conditioning channel and configured to receive the conditioned current sensor signal, the integrated circuit-based controller being configured to execute instructions stored in at least one nontransitory memory medium to determine at least one frequency value and at least one magnitude value of the conditioned current sensor signal, evaluate a trip condition in response to the at least one frequency value and the at least one magnitude value, and provide a fault trip signal in response to evaluation of the trip condition; and a circuit breaker mechanism operatively coupled with the integrated circuit-based controller and configured to open a circuit of the AC power system in response to the fault trip signal.

A second example embodiment includes the features of the first example embodiment, wherein the integrated circuit-based controller is configured to determine the at least one frequency value using a transform operation to convert from a time domain to a frequency domain.

A third example embodiment includes the features of the first example embodiment, wherein the integrated circuit-based controller is configured to determine the at least one frequency value in response to an input to a counter of the integrated circuit-based controller.

A fourth example embodiment includes the features of the first example embodiment, wherein the integrated circuit-based controller is configured to determine the at least one frequency value in response to an input to an analog-to-digital converter of the integrated circuit-based controller.

A fifth example embodiment includes the features of the first example embodiment, wherein the integrated circuit-based controller is configured to evaluate the trip condition by determining a magnitude threshold in response to the at least one frequency value and evaluating the at least one magnitude value relative to the magnitude threshold.

A sixth example embodiment includes the features of the fifth example embodiment, wherein the integrated circuit-based controller is configured to one of increment and decrement a counter in response to evaluating the at least one magnitude value relative to the magnitude threshold.

A seventh example embodiment includes the features of the first example embodiment, wherein the integrated circuit-based controller is configured to increment the counter in response to the at least one magnitude value being one of greater than the magnitude threshold and greater than or equal to the magnitude threshold.

An eighth example embodiment includes the features of the sixth example embodiment, wherein the integrated circuit-based controller is configured to decrement the counter in response to the at least one magnitude value being one of less than the magnitude threshold and less than or equal to the magnitude threshold.

A ninth example embodiment includes the features of the first example embodiment, wherein the at least one signal conditioning channel comprises a single signal conditioning channel.

A tenth example embodiment includes the features of the ninth example embodiment, wherein the single signal conditioning channel provides the only information indicative of the AC leakage current used by the integrated circuit-based controller to determine at least one frequency value and at least one magnitude value of the conditioned current sensor signal, evaluate a trip condition in response to the at least one frequency value and the at least one magnitude value, and provide a fault trip signal in response to evaluation of the trip condition.

An eleventh example embodiment includes the features of the first example embodiment, wherein the at least one signal conditioning channel comprises a first signal conditioning channel and a second signal conditioning channel.

A twelfth example embodiment includes the features of the eleventh example embodiment, wherein the first signal conditioning channel and a second signal conditioning channel comprise the only information indicative of the AC leakage current used by the integrated circuit-based controller to determine at least one frequency value and at least one magnitude value of the conditioned current sensor signal, evaluate a trip condition in response to the at least one frequency value and the at least one magnitude value, and provide a fault trip signal in response to evaluation of the trip condition.

A thirteenth example embodiment is a method comprising: operating a current sensor system to provide a current sensor signal indicating a leakage current of an AC power system; providing a conditioned current sensor signal using circuitry of at least one signal conditioning channel; providing the conditioned current sensor signal at an integrated circuit-based controller; operating the integrated circuit-based controller to perform the acts of determining at least one frequency value and at least one magnitude value of the conditioned current sensor signal, evaluating a trip condition in response to the at least one frequency value and the at least one magnitude value, and providing a fault trip signal in response to evaluation of the trip condition; and operating a circuit breaker mechanism to open a circuit of the AC power system in response to the fault trip signal.

A fourteenth example embodiment includes the features of the thirteenth example embodiment, wherein the act of determining the at least one frequency value includes performing a transform operation to convert from a time domain to a frequency domain.

A fifteenth example embodiment includes the features of the thirteenth example embodiment, wherein the act of determining the at least one frequency value includes calculating a frequency in response to a number of inputs to a counter of the integrated circuit-based controller over a defined time period.

A sixteenth example embodiment includes the features of the thirteenth example embodiment, wherein the integrated circuit-based controller is configured to determine the at least one frequency value in response to an input to an analog-to-digital converter of the integrated circuit-based controller.

A seventeenth example embodiment includes the features of the thirteenth example embodiment, wherein the integrated circuit-based controller is configured to evaluate the trip condition by determining a magnitude threshold in response to the at least one frequency value and evaluating the at least one magnitude value relative to the magnitude threshold.

A eighteenth example embodiment includes the features of the seventeenth example embodiment, wherein the integrated circuit-based controller is configured to one of increment and decrement a counter in response to evaluating the at least one magnitude value relative to the magnitude threshold.

A nineteenth example embodiment includes the features of the eighteenth example embodiment, wherein the integrated circuit-based controller is configured to increment the counter in response to the at least one magnitude value being one of greater than the magnitude threshold and greater than or equal to the magnitude threshold.

A twentieth example embodiment includes the features of the nineteenth example embodiment, wherein the integrated circuit-based controller is configured to decrement the counter in response to the at least one magnitude value being one of less than the magnitude threshold and less than or equal to the magnitude threshold.

A twenty-first example embodiment includes the features of the thirteenth example embodiment, wherein the at least one signal conditioning channel comprises a single signal conditioning channel.

A twenty-second example embodiment includes the features of the twenty-first example embodiment, wherein the single signal conditioning channel provides the only input the integrated circuit-based controller to determine at least one frequency value and at least one magnitude value of the conditioned current sensor signal, evaluate a trip condition in response to the at least one frequency value and the at least one magnitude value, and provide a fault trip signal in response to evaluation of the trip condition.

A twenty-third example embodiment includes the features of the thirteenth example embodiment, wherein the at least one signal conditioning channel comprises a first signal conditioning channel and a second signal conditioning channel.

A twenty-fourth example embodiment includes the features of the twenty-third example embodiment, wherein the first signal conditioning channel and a second signal conditioning channel comprise the only inputs used by the integrated circuit-based controller to determine at least one frequency value and at least one magnitude value of the conditioned current sensor signal, evaluate a trip condition in response to the at least one frequency value and the at least one magnitude value, and provide a fault trip signal in response to evaluation of the trip condition.

While example embodiments of the disclosure have been illustrated and described in detail in the drawings and foregoing description, the same is to be considered as illustrative and not restrictive in character, it being understood that only certain example embodiments have been shown and described and that all changes and modifications that come within the spirit of the claimed inventions are desired to be protected. It should be understood that while the use of words such as preferable, preferably, preferred or more preferred utilized in the description above indicates that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

The invention claimed is:

1. An apparatus comprising:
a current sensor system configured to operatively couple with an AC power system and configured to provide a current sensor signal indicating a leakage current of the AC power system;
at least one signal conditioning channel including one or more of discrete circuit components and integrated circuit components configured to condition the current sensor signal to provide a conditioned current sensor signal;
an integrated circuit-based controller operatively coupled with the at least one signal conditioning channel and configured to receive the conditioned current sensor signal, the integrated circuit-based controller being configured to execute instructions stored in at least one non-transitory memory medium to determine at least one frequency value and at least one magnitude value of the conditioned current sensor signal, evaluate a trip condition in response to the at least one frequency value and the at least one magnitude value, and provide a fault trip signal in response to evaluation of the trip condition, wherein the integrated circuit-based controller is configured to evaluate the trip condition by determining a magnitude threshold in response to the at least one frequency value and evaluating the at least one magnitude value relative to the magnitude threshold; and
a circuit breaker mechanism operatively coupled with the integrated circuit-based controller and configured to open a circuit of the AC power system in response to the fault trip signal.

2. The apparatus of claim 1, wherein the integrated circuit-based controller is configured to determine the at least one frequency value using a transform operation to convert from a time domain to a frequency domain.

3. The apparatus of claim 1, wherein the integrated circuit-based controller is configured to determine the at least one frequency value in response to an input to a counter of the integrated circuit-based controller.

4. The apparatus of claim 1, wherein the integrated circuit-based controller is configured to determine the at least one frequency value in response to an input to an analog-to-digital converter of the integrated circuit-based controller.

5. The apparatus of claim 1, wherein the integrated circuit-based controller is configured to one of increment and decrement a counter in response to evaluating the at least one magnitude value relative to the magnitude threshold.

6. The apparatus of claim 5, wherein the integrated circuit-based controller is configured to increment the counter in response to the at least one magnitude value being one of greater than the magnitude threshold and greater than or equal to the magnitude threshold.

7. The apparatus of claim 5, wherein the integrated circuit-based controller is configured to decrement the counter in response to the at least one magnitude value being one of less than the magnitude threshold and less than or equal to the magnitude threshold.

8. The apparatus of claim 1, wherein the at least one signal conditioning channel comprises a single signal conditioning channel.

9. The apparatus of claim 8, wherein the single signal conditioning channel provides the only information indicative of the AC leakage current used by the integrated circuit-based controller to determine at least one frequency value and at least one magnitude value of the conditioned current sensor signal, evaluate a trip condition in response to the at least one frequency value and the at least one magnitude value, and provide a fault trip signal in response to evaluation of the trip condition.

10. The apparatus of claim 1, wherein the at least one signal conditioning channel comprises a first signal conditioning channel and a second signal conditioning channel.

11. The apparatus of claim 10, wherein the first signal conditioning channel and a second signal conditioning channel comprise the only information indicative of the AC leakage current used by the integrated circuit-based controller to determine at least one frequency value and at least one magnitude value of the conditioned current sensor signal, evaluate a trip condition in response to the at least one frequency value and the at least one magnitude value, and provide a fault trip signal in response to evaluation of the trip condition.

12. A method comprising:
operating a current sensor system to provide a current sensor signal indicating a leakage current of an AC power system;
providing a conditioned current sensor signal using circuitry of at least one signal conditioning channel;
providing the conditioned current sensor signal at an integrated circuit-based controller;
operating the integrated circuit-based controller to perform the acts of determining at least one frequency value and at least one magnitude value of the conditioned current sensor signal, evaluating a trip condition in response to the at least one frequency value and the at least one magnitude value, and providing a fault trip signal in response to evaluation of the trip condition, wherein the integrated circuit-based controller is configured to evaluate the trip condition by determining a magnitude threshold in response to the at least one frequency value and evaluating the at least one magnitude value relative to the magnitude threshold; and
operating a circuit breaker mechanism to open a circuit of the AC power system in response to the fault trip signal.

13. The method of claim 12, wherein the act of determining the at least one frequency value includes performing a transform operation to convert from a time domain to a frequency domain.

14. The method of claim 12, wherein the act of determining the at least one frequency value includes calculating a frequency in response to a number of inputs to a counter of the integrated circuit-based controller over a defined time period.

15. The method of claim 12, wherein the integrated circuit-based controller is configured to determine the at least one frequency value in response to an input to an analog-to-digital converter of the integrated circuit-based controller.

16. The method of claim 12, wherein the integrated circuit-based controller is configured to one of increment and decrement a counter in response to evaluating the at least one magnitude value relative to the magnitude threshold.

17. The method of claim 16, wherein the integrated circuit-based controller is configured to increment the counter in response to the at least one magnitude value being one of greater than the magnitude threshold and greater than or equal to the magnitude threshold.

18. The method of claim 17, wherein the integrated circuit-based controller is configured to decrement the counter in response to the at least one magnitude value being one of less than the magnitude threshold and less than or equal to the magnitude threshold.

19. The method of claim 12, wherein the at least one signal conditioning channel comprises a single signal conditioning channel.

20. The method of claim 19, wherein the single signal conditioning channel provides the only input the integrated circuit-based controller to determine at least one frequency value and at least one magnitude value of the conditioned current sensor signal, evaluate a trip condition in response to the at least one frequency value and the at least one magnitude value, and provide a fault trip signal in response to evaluation of the trip condition.

21. The method of claim 12, wherein the at least one signal conditioning channel comprises a first signal conditioning channel and a second signal conditioning channel.

22. The method of claim 21, wherein the first signal conditioning channel and a second signal conditioning channel comprise the only inputs used by the integrated circuit-based controller to determine at least one frequency value and at least one magnitude value of the conditioned current sensor signal, evaluate a trip condition in response to the at least one frequency value and the at least one magnitude value, and provide a fault trip signal in response to evaluation of the trip condition.

\* \* \* \* \*